(12) United States Patent
Kondoh

(10) Patent No.: US 8,382,088 B2
(45) Date of Patent: Feb. 26, 2013

(54) SUBSTRATE PROCESSING APPARATUS

(75) Inventor: Keisuke Kondoh, Nirasaki-Shi (JP)

(73) Assignee: Tokyo Electron Limited, Tokyo (JP)

( * ) Notice: Subject to any disclaimer, the term of this patent is extended or adjusted under 35 U.S.C. 154(b) by 631 days.

(21) Appl. No.: 12/532,190

(22) PCT Filed: Mar. 28, 2008

(86) PCT No.: PCT/JP2008/056082
§ 371 (c)(1),
(2), (4) Date: Sep. 21, 2009

(87) PCT Pub. No.: WO2008/120716
PCT Pub. Date: Oct. 9, 2008

(65) Prior Publication Data
US 2010/0102030 A1  Apr. 29, 2010

(30) Foreign Application Priority Data
Mar. 30, 2007  (JP) ................................. 2007-095376

(51) Int. Cl.
*B25B 1/22* (2006.01)
(52) U.S. Cl. .......... 269/903; 269/21; 118/719; 414/805; 437/225; 451/56
(58) Field of Classification Search .................. 269/903, 269/289 R, 900, 21; 29/281.1; 118/719; 414/805; 156/345.31, 345.27, 345; 437/225, 437/166, 478; 451/28, 41, 56, 54
See application file for complete search history.

(56) References Cited

U.S. PATENT DOCUMENTS

| 6,007,675 | A  | * | 12/1999 | Toshima .................. 156/345.32 |
| 7,160,180 | B2 | * | 1/2007 | Isobe et al. ...................... 451/54 |
| 7,943,528 | B2 | * | 5/2011 | Yanagisawa et al. ......... 438/758 |
| 2007/0051312 | A1 | * | 3/2007 | Sneh ............................. 118/719 |
| 2009/0064931 | A1 | * | 3/2009 | Horii et al. .................... 118/708 |
| 2009/0179003 | A1 | * | 7/2009 | Nishimura ....................... 216/41 |
| 2010/0102030 | A1 | * | 4/2010 | Kondoh .......................... 216/58 |

FOREIGN PATENT DOCUMENTS

| JP | 06-260546 | 9/1994 |
| JP | 06-329208 | 11/1994 |

(Continued)

OTHER PUBLICATIONS

Chinese Office Action dated Sep. 19, 2010 with partial translation.

(Continued)

*Primary Examiner* — Lee D Wilson
(74) *Attorney, Agent, or Firm* — Ipusa, PLLC

(57) ABSTRACT

A substrate processing apparatus is disclosed for bringing a substrate from a carrier, by a substrate transfer portion inside a transfer chamber, into a processing module to perform a process therein. The substrate processing apparatus includes a substrate storing chamber coupled to an exterior of the transfer chamber via a transfer opening to be in communications with the transfer chamber; a first storing shelf in the substrate storing chamber to store substrates for a first storing purpose; a second storing shelf in the substrate storing chamber to store substrates for a second storing purpose different from the first storing purpose; and a shifting mechanism that shifts the first and the second storing shelves to position a substrate storing area of one of the first and the second storing shelves so that substrate transferring is enabled between the substrate storing area and the substrate transfer portion via the transfer opening.

13 Claims, 12 Drawing Sheets

FOREIGN PATENT DOCUMENTS

| | | |
|---|---|---|
| JP | 07-117809 | 5/1995 |
| JP | 08-148503 | 6/1996 |
| JP | 11-111810 | 4/1999 |
| JP | 11-251255 | 9/1999 |
| JP | 2002-222844 | 8/2002 |
| JP | 2004-304116 | 10/2004 |
| JP | 2004304116 A * | 10/2004 |
| JP | 2007-027339 | 2/2007 |

OTHER PUBLICATIONS

Japanese Office Action dated Jan. 25, 2011 with partial translation.
Korean Office Action dated Aug. 31, 2010 with partial translation.
Taiwanese Office Action dated Apr. 17, 2012 with partial English translation.

* cited by examiner

SUBSTRATE PROCESSING APPARATUS

TECHNICAL FIELD

The present invention relates to a substrate processing apparatus that carries out a substrate process in a processing module, and specifically to a technology for storing a wafer in the processing apparatus for different purposes.

BACKGROUND ART

In semiconductor device manufacturing, there is an operation in which a vacuum process such as an etching process and the like is carried out on a substrate to be processed, for example, a semiconductor wafer (referred to as a wafer, hereinafter). In order to carry out such a process at a high throughput, a vacuum processing apparatus called a multi-chamber system and the like is used.

Among the vacuum processing apparatuses, one having a vacuum processing chamber and an atmospheric transfer chamber has been known. An example of such a vacuum processing apparatus is shown in FIG. 1. A vacuum processing apparatus 100 is composed of a load port 110 provided with a stage on which a carrier C such as a Front Opening Unified Pod (FOUP) and the like that houses plural (e.g., twenty five) wafers W is placed, a transfer module (TM) 111 that has a transfer arm for transferring the wafer W and is kept under a vacuum environment, four processing modules (PM) 112a through 112d that are arranged around the transfer module (TM) 111 and where predetermined processes are carried out on the wafer W, a loader module (LM) 114 that has a substrate transfer portion provided with a transfer arm that transfers the wafer and is kept under an aerial environment, two load lock modules (LLM) 115 that are arranged between the loader module 114 and the transfer module 111 and whose inner space is switchable between a vacuum environment and a normal pressure aerial environment, and an alignment chamber (ORT) (not shown) that is arranged adjacent to the loader module 114 and carries out pre-alignment of a position of the wafer W. Reference symbols G11 and G12 in FIG. 1 represent gate valves.

A transfer route of the wafer in the vacuum processing chamber 100 is briefly stated. The wafer W that is unprocessed and stored in the carrier C on the load port 110 is transferred to LM114, ORT, LLM115, TM111, and PMs112a through 112d in this order. Then, after an etching process, for example, is carried out under an environment of a predetermined processing gas in the processing modules 112 through 112d, the processed wafer W is transferred to TM111, LM115, LM114, and the load port 110 in this order.

When the processed wafer W is transferred back to the load port 110, there may be a problem of so-called cross-contamination in which reaction products on the processed wafer W react with moisture in the atmosphere to produce a gas and this gas may be condensed on an unprocessed wafer W, thereby causing device defects. As measures against such cross-contamination, a purge storage 113 that stores the processed wafer W in an aerial environment is provided to the loader module 114.

In addition, in the substrate processing apparatus 100, when an inside of a processing chamber of the processing modules 112a through 112d is cleaned with a cleaning gas, a dummy substrate DW may be placed on a susceptor provided in the processing chamber in order to prevent a susceptor surface of the susceptor from being etched. A dummy storage 116 that stores such a dummy substrate DW is attached to the loader module 114 in a different position from the position where the purge storage 113 is attached.

However, because the substrate processing apparatus 100 so configured requires installing spaces for the storages 113, 116 depending on kinds of the storages, and the installing spaces and the number of the wafers to be stored are restricted due to an access area of the transfer arm, flexibility in designing a layout of the apparatus is limited and a foot print may not be reduced.

Patent document 1 describes a semiconductor fabrication apparatus in which a substrate transfer portion in a transfer chamber can access a wafer cassette and a dummy storage by providing the dummy storage below a carrier susceptor arranged in a cassette chamber and elevating the carrier susceptor. However, Patent document 1 does not describe a technology for storing plural kinds of wafers in the apparatus, or address an apparatus layout problem.

Patent document 1: Japanese Patent Application Laid-Open Publication No. 2002-222844 (paragraphs 0019 through 0029, FIG. 1)

SUMMARY OF INVENTION

Problems to be Solved by the Invention

The present invention has been made under such circumstances, and is directed to a substrate processing apparatus and a substrate processing method that are capable of aggregating plural kinds of substrate storage shelves in one place, thereby allowing an improved design of an apparatus layout, and a storage medium for storing the substrate processing method.

Means of Solving the Problems

A first aspect of the present invention provides a substrate processing apparatus for bringing a substrate out from a carrier placed on a transfer port, by a substrate transfer portion inside a transfer chamber, into a processing module in order to perform a substrate process in the processing module. The substrate processing apparatus includes a substrate storing chamber coupled to an exterior of the transfer chamber via a transfer opening in order to be in communication with the transfer chamber; a first storing shelf provided in the substrate storing chamber in order to store plural substrates for a first storing purpose; a second storing shelf provided in the substrate storing chamber in order to store plural substrates for a second storing purpose different from the first storing purpose; and a shifting mechanism that shifts the first and the second storing shelves in order to position a substrate storing area of one of the first and the second storing shelves so that substrate transferring is enabled between the substrate storing area and the substrate transfer portion via the transfer opening.

A second aspect of the present invention provides a substrate processing apparatus according to the first aspect, wherein at least one of the plural substrates is processed under a vacuum environment in the processing module; wherein the transfer chamber includes a normal pressure transfer chamber at a normal pressure, the normal pressure transfer chamber being coupled to the transfer port and having a first substrate transfer chamber; and a vacuum transfer chamber provided between the normal pressure transfer chamber and the processing chamber and having a second substrate transfer portion; and wherein the substrate storing chamber is coupled to the normal pressure transfer chamber.

A third aspect of the present invention provides a substrate processing apparatus according to the first or the second aspects, wherein a flow of a purge gas may be produced in the first storing shelf in order to blow off a reaction product on the substrate that has been processed in the processing module.

A fourth aspect of the present invention provides a substrate processing apparatus according to the third aspect, wherein the substrate storing chamber includes an evacuation opening that evacuates the purge gas in order to produce the purge gas flow.

A fifth aspect of the present invention provides a substrate processing apparatus according to any one of the first through the fourth aspects, wherein the second storing shelf stores a dummy substrate.

A sixth aspect of the present invention provides a substrate processing apparatus according to any one of the first through the fifth aspects, wherein the first storing shelf and the second storing shelf are vertically arranged, and wherein the shifting mechanism is configured to elevate the first and the second storing shelves.

A seventh aspect of the present invention provides a substrate processing apparatus according to the sixth aspect, wherein the shifting mechanism is configured to independently elevate the first and the second storing shelves.

An eighth aspect of the present invention provides a substrate processing apparatus according to the sixth aspect, wherein the shifting mechanism is configured to elevate the first and the second storing shelves in unison.

A ninth aspect of the present invention provides a substrate processing apparatus according to any one of the first through the fifth aspects, wherein the first and the second storing shelves are arranged in line from side to side, seen from the transfer opening, and wherein the shifting mechanism is configured to move the first and the second storing shelves from side to side.

A tenth aspect of the present invention provides a substrate processing apparatus according to any one of the first through the fifth aspect, wherein the first and the second storing shelves are arranged on a rotational member rotatable around a vertical axis in order to surround the vertical axis, and wherein the shifting mechanism is configured to rotate the rotational member.

An eleventh aspect of the present invention provides a substrate processing method for bringing a substrate out from a carrier placed on a transfer port, using a substrate transfer portion inside a transfer chamber, to a processing module and performing a substrate process in the processing module. The substrate processing method includes steps of: positioning a first storing shelf provided in a substrate storing chamber coupled to an exterior of a transfer chamber via a transfer opening in order to be in communication with the transfer chamber so that a substrate storing area of the first storing shelf is aligned to the transfer opening, using a shifting mechanism; transferring a substrate from the transfer chamber via the transfer opening to the first storing shelf using the substrate transfer portion, for a first storing purpose; positioning a second storing shelf provided in the substrate storing chamber so that a substrate storing area of the second storing shelf is aligned to the transfer opening using the shifting mechanism; and transferring a substrate from the transfer chamber via the transfer opening to the second storing shelf using the substrate transfer portion, for a second storing purpose different from the first storing purpose.

A twelfth aspect of the present invention provides a substrate processing method according to an eleventh aspect, wherein the first storing purpose lies in storing a substrate in an environment in which a purge gas flow may be produced in order to blow off a reaction product on the substrate that has been processed in the processing module.

A thirteenth aspect of the present invention provides a substrate processing method according to the eleventh aspect, wherein the second storing purpose lies in storing a dummy substrate.

A fourteenth aspect of the present invention provides a computer readable storage medium that stores a program to be used in a substrate processing apparatus for bringing a substrate out from a carrier placed on a transfer port, by a substrate transfer portion inside a transfer chamber, into a processing module in order to perform a substrate process in a processing module, the program incorporating steps to perform a substrate processing method according to the eleventh aspect.

Effects of the Invention

According to the present invention, plural kinds of substrate storage shelves to be used for different storing purposes are integrated into one unit and aggregated in one place, an access position of a substrate transfer portion is shared for each of the substrate storage shelves, and the substrate storage shelves are moved to be in the access position. Therefore, because one appropriate position of the unit is determined by taking into consideration moving areas of the substrate storing shelves, designing flexibility of a layout of a substrate processing apparatus is enhanced and the designing is easily carried out, compared with a case where different kinds of the substrate storing shelves are separately arranged in different places and independently coupled to a transfer chamber.

DESCRIPTION OF THE REFERENCE NUMERALS

Figure 1:
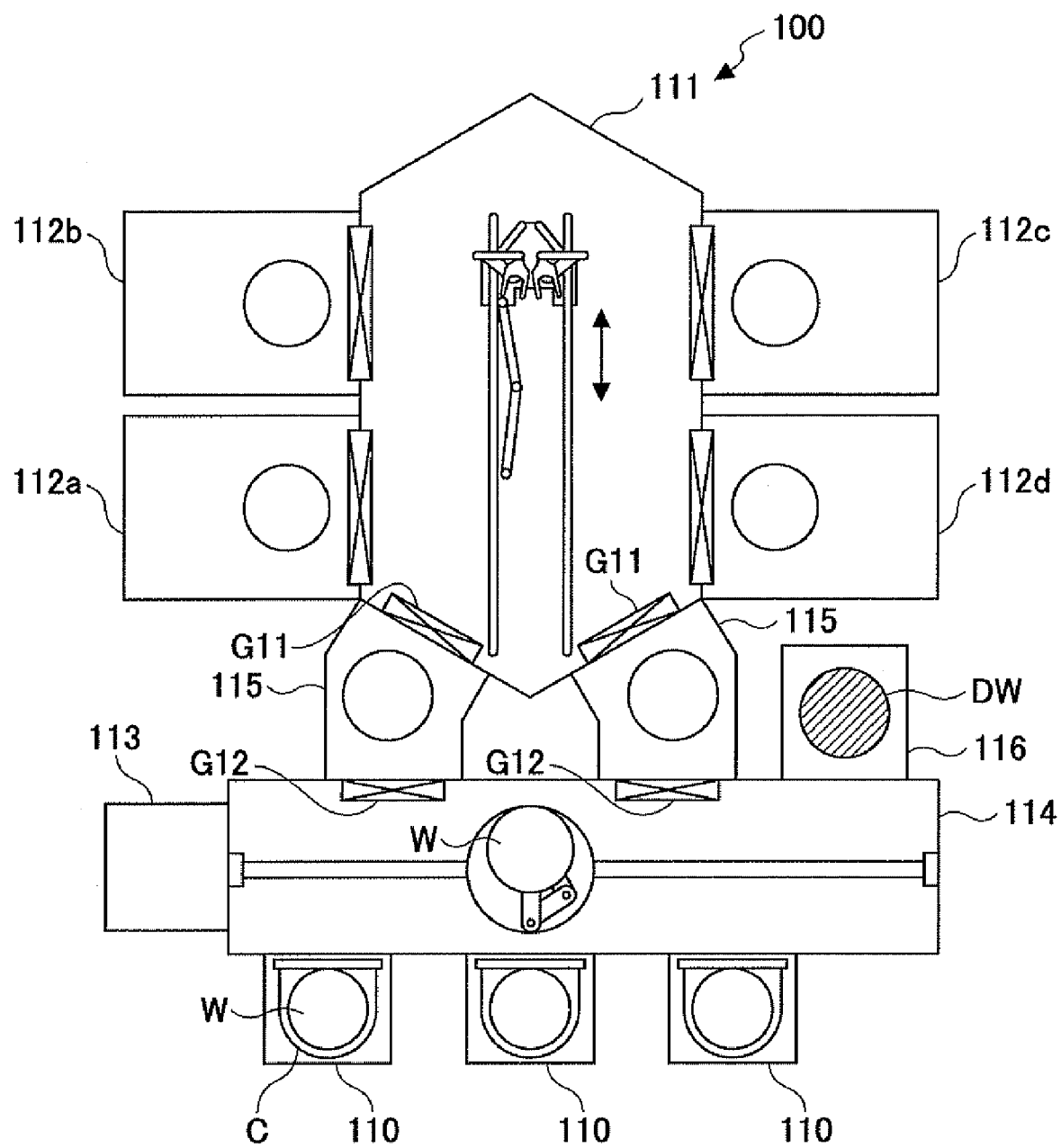
FIG. 1 is a plan view illustrating a configuration of a related art substrate processing apparatus.

C carrier
DW dummy substrate
W wafer
1, 1a, 1b multi-storage unit 2 purge storage unit
3 dummy storage unit
4 substrate processing apparatus
5 rotational member
11 unit cover
11a evacuation opening
12 evacuation portion
13 controlling portion
14 elevation mechanism
15 shifting mechanism
21 purge storage
21a ceiling plate
21b holding member
21c back plate
21d opening
22 elevation mechanism
31 dummy storage
31a isolation wall
31b holding member
32 elevation mechanism
41 load port
41a open/close door
42 loader module
42a first substrate transfer portion
42b transfer opening
43 load lock chamber
43a susceptor
44 transfer module
44a second substrate transfer portion
45a through 45d processing module
51 storage
52 vertical plate
52a rotational shaft
53 bottom plate
53a flow opening
53b cavity
54 rotary motor

MODE (S) FOR CARRYING OUT THE INVENTION (First Embodiment)

Figure 2:
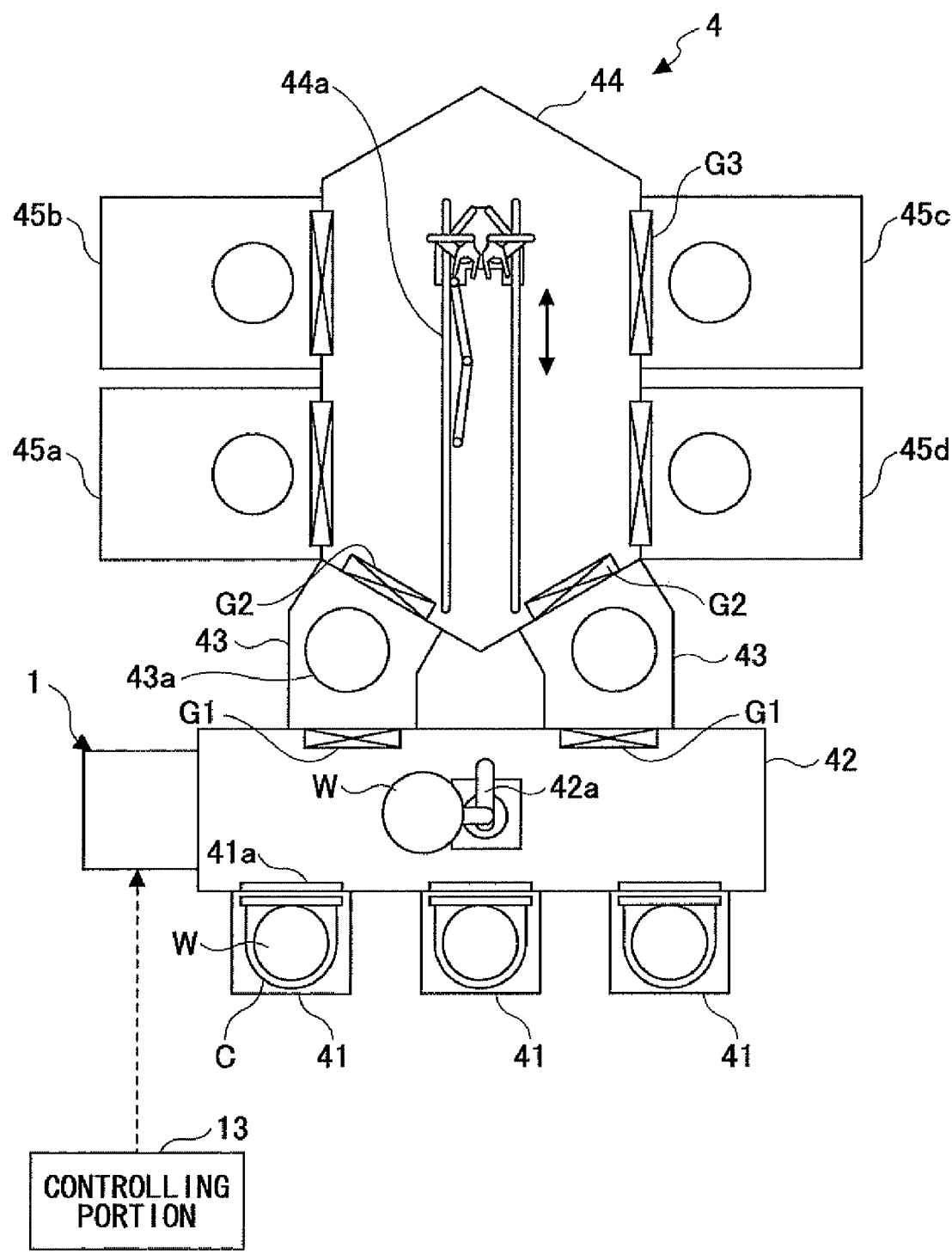
FIG. 2 is a plan view of a substrate processing apparatus according to an embodiment of the present invention.

An entire configuration of a substrate processing apparatus according to an embodiment of the present invention is explained in the following. As shown in a plan view of FIG. 2, a substrate processing apparatus 4 is provided with a load port 41 for connecting a carrier C that houses the predetermined number of the wafers W to be processed to a main body of the substrate processing apparatus 4; a loader module 42 as a normal pressure transfer chamber in which the wafers W are transferred under a normal pressure aerial environment; two load lock chambers 43 whose inner space is switchable between a vacuum environment and a normal pressure aerial environment, and that hold the wafer W when the wafer W is transferred, the load lock chambers being arranged from side to side; a transfer module 44 as a vacuum transfer chamber in which the wafer W is transferred under a vacuum environment; and four processing modules 45a through 45d in which the wafer W transferred therein is processed. The load port 41, the loader module 42, the load lock chamber 43, the transfer module 44, and the processing modules 45a through 45d are arranged in this order in a transferring direction of the wafer W. The adjacent modules and/or chambers are hermetically coupled to each other through doors 41a and gate valves G1 through G3. Incidentally, it is assumed in the explanation of the substrate processing apparatus 4 as a whole that the load port 41 is located in the front side.

The load port 41 includes three susceptors arranged in line in front of the loader module 42, and has a function of connecting the carrier C that is transferred in and placed on the load port 41 to the substrate processing apparatus 4. Inside the loader module 42, a first substrate transfer unit 42a for bringing out the wafer W one by one from the carrier C and transferring the wafer W, is provided. The first substrate transfer unit 42a is rotatable, stretchable, elevatable, and movable from side to side. On a side surface of the loader module 42A, there is provided a multi-storage unit 1 including a purge storage in which a processed wafer W is temporarily stored in order to prevent cross-contamination of the wafers W, which has been explained in the Description of the Related Art section, and a dummy storage in which a dummy substrate DW, to be used when cleaning the processing modules 45a through 45d, is stored. In addition, an alignment chamber (not shown) housing an orienter for positioning the wafer is also provided on the side surface of the loader module 42. Incidentally, the inside of the loader module 42 may be kept in a normal pressure environment of inert gases, nitrogen gas or the like, rather than an aerial environment.

The two load lock chambers 43 are provided with a susceptor 43a on which the transferred wafer W is placed, and connected to a vacuum pump and a leak valve (not shown) in order to switch the inner space between a normal pressure environment and a vacuum environment. The transfer module 44 has, for example, a lengthened hexagonal top view shape, and is connected at two edges in the front side to the load lock chambers 43 and at long edges opposing each other to the processing modules 45a through 45d. Inside the transfer module 44, a rotatable and stretchable first substrate transfer unit 42a is arranged in order to transfer the wafer W under a vacuum environment between the load lock chambers 43 and the processing modules 45a through 45d. In addition, the transfer module 44 is connected to a vacuum pump (not shown) in order to keep the inner space in a vacuum environment.

The processing modules 45a through 45d are provided with susceptors on which the wafer W is placed, a gas showerhead (not shown) through which process gases are supplied and the like, and are connected to vacuum pumps (not shown) to carry out processes such as an etching process using an etching gas, a film deposition process using a deposition gas, an ashing process using an ashing gas, and the like. Different processes may be carried out in the different processing modules 45a through 45d, or the same process may be carried out in the processing modules 45a through 45d.

Figure 3:
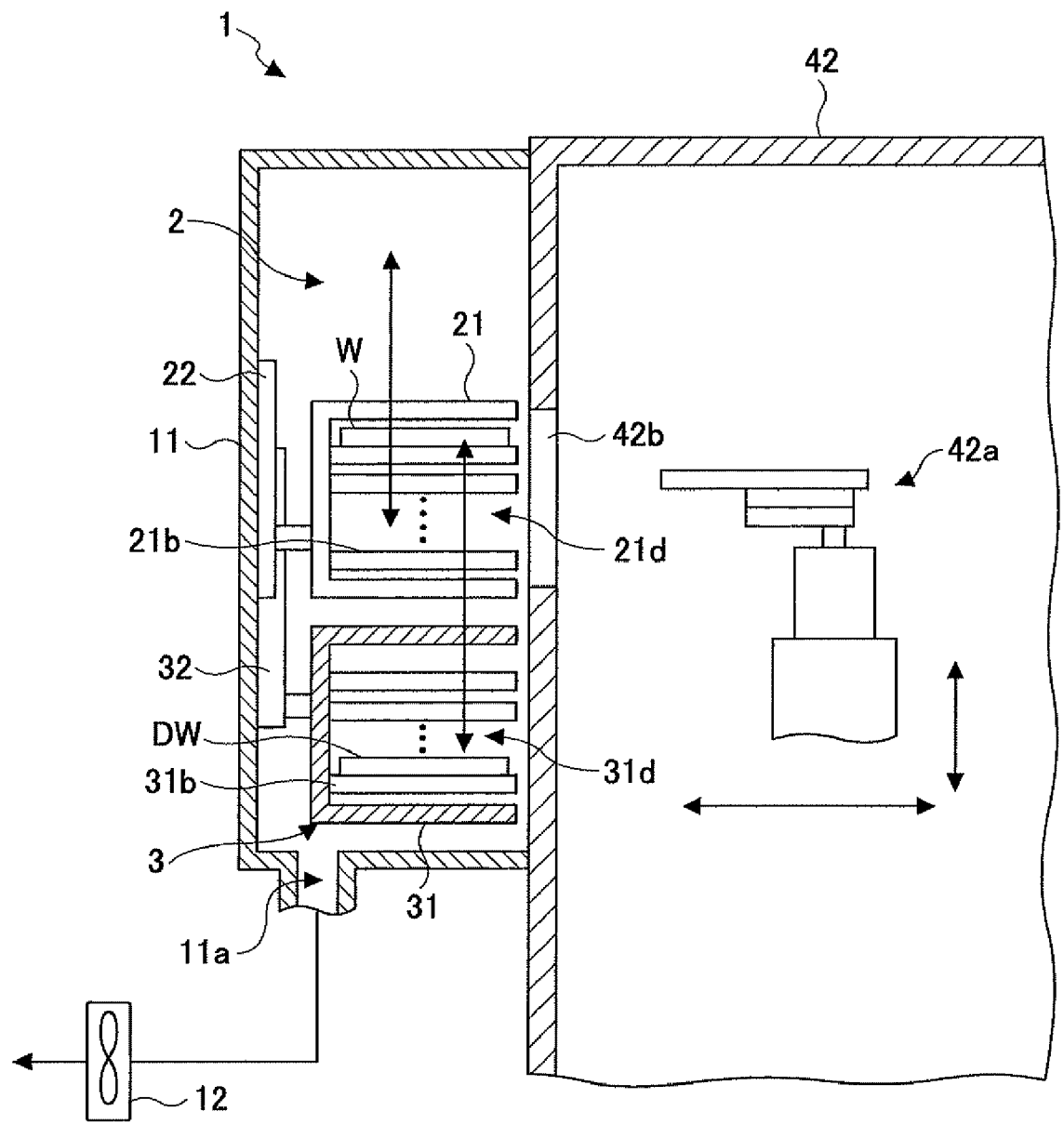
FIG. 3 is a cross-sectional view illustrating an inner structure of a multi-storage unit provided in the substrate processing apparatus.
Figure 4:
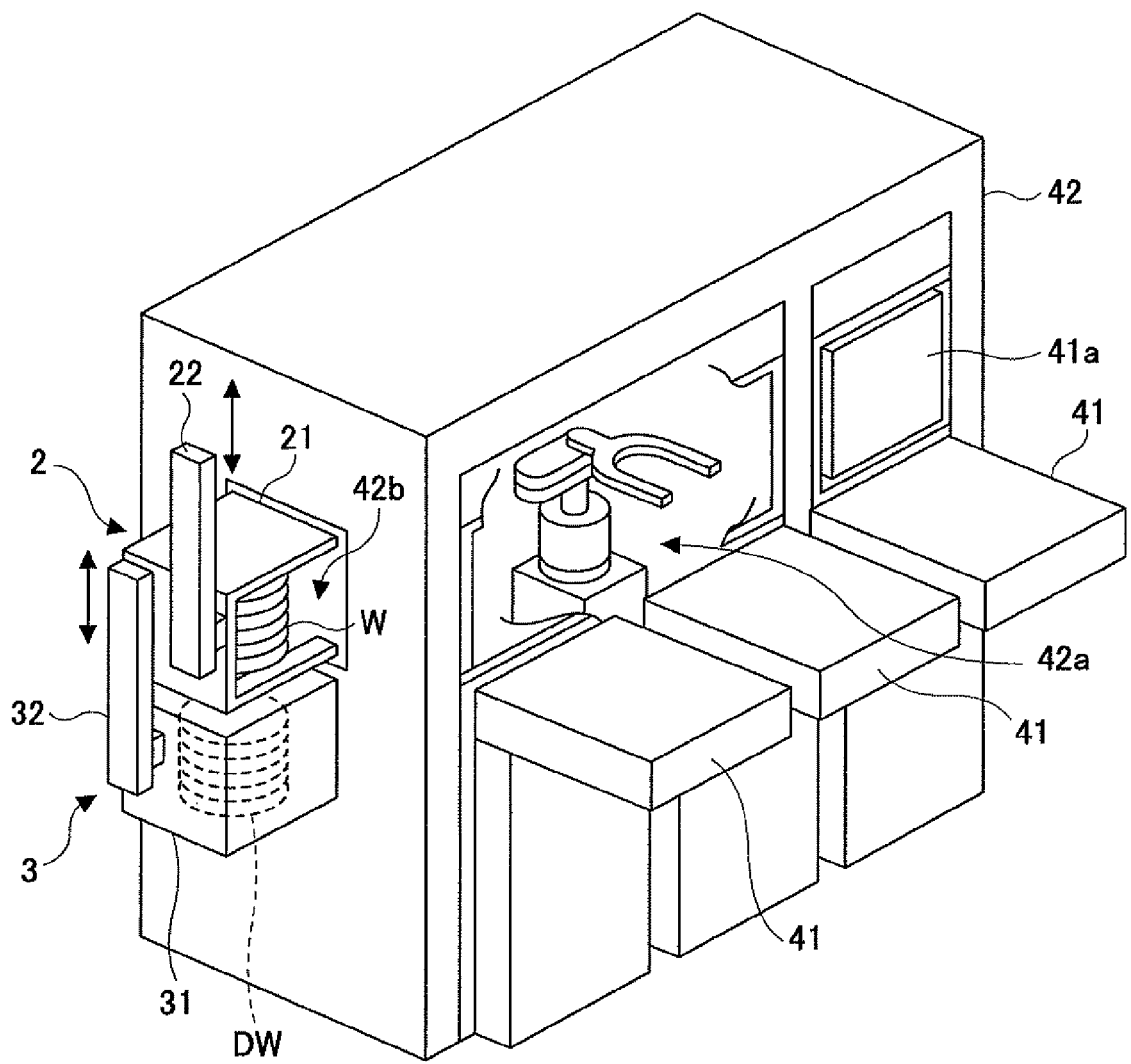
FIG. 4 is a perspective view illustrating an inner structure of a multi-storage unit.
Figure 5:
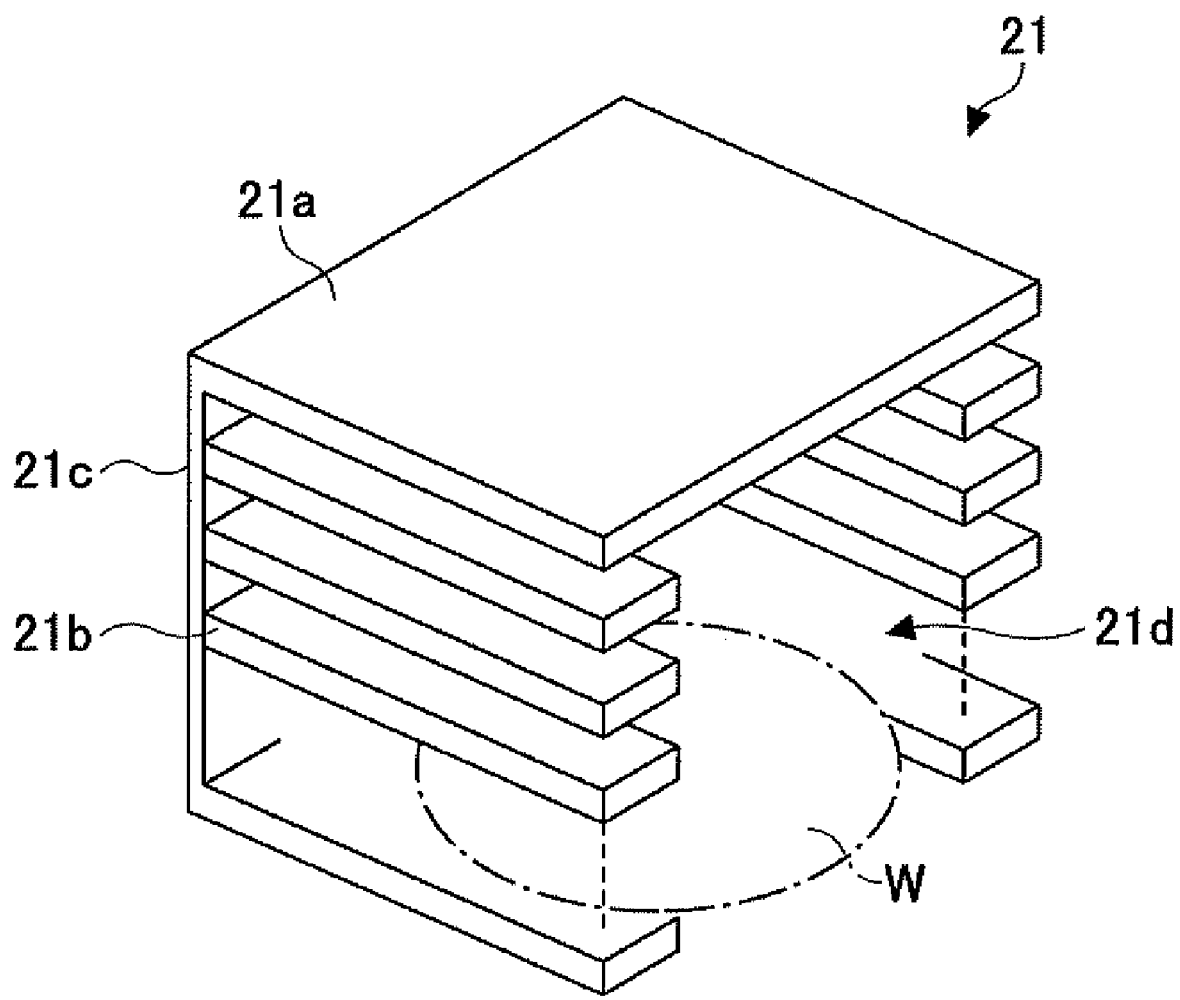
FIG. 5 is a perspective view of a purge storage provided inside the multi-storage unit.

As described above, the substrate processing apparatus 4 according to this embodiment includes the two storages (substrate storing shelves) in the shared multi-storage unit 1, for different purposes, one for storing the processed wafers W and the other for storing the dummy substrates DW. In the following, the detailed configuration thereof is explained with reference to FIGS. 3 through 5. FIG. 3 is a cross-sectional view illustrating an inner configuration of the multi-storage unit 1, and FIG. 4 is a perspective view also illustrating the inner configuration. Incidentally, a unit cover 11 that defines a wafer storing chamber of the multi-storage unit 1 is removed in FIG. 4, which is the perspective view, for simplicity of illustration. In addition, FIG. 5 is a perspective view illustrating a configuration of a purge storage 21 in which the processed wafers W are stored. In the explanation of the multi-storage unit 1, a direction along which the wafer W and the dummy substrate DW are transferred in is directed toward the front side.

The multi-storage unit 1 is composed of a purge storage unit 2 for the processed wafers W, a dummy storage unit 3 for the dummy substrates DW, and the unit cover 11 that houses the purge storage unit 2 and the dummy storage unit 3, as shown in FIGS. 3 and 4. The unit cover 11 is attached on an outer wall surface of the loader module 42 as shown in FIG. 3 and houses the storage units 2, 3. A transfer opening 42b having a traverse width that allows, for example, a 300 mm wafer to be transferred in/out therethrough is formed in a wall surface covered by the unit cover 11 in the loader module 42. The transfer opening 42b is positioned corresponding to an elevation range of the first substrate transfer unit 42a, and has a height that allows the first substrate transfer unit 42a to access the multi-storage unit 1. In a bottom portion of the unit cover 11, an evacuation opening 11a connected to the evacuation portion 12 is provided, and thus a gaseous current of the purge gas flowing from the loader module 42 through the transfer opening 42b to the unit cover 11 and then being evacuated from the evacuation opening 11a is produced.

The purge storage unit 2 is composed of the purge storage 21, which is a first storage shelf for temporarily storing the processed wafers W, and an elevation mechanism 22 for independently elevating the purge storage 21. The purge storage 21 is provided with multi-staged holding members 21b that hold circumferential edges of the wafers W, a back plate 21c to which the holding members 21b are attached, and a ceiling plate 21a arranged above a topmost holding member 21b and attached to the back plate 21c. The holding members 21b have U shapes that allow an arm of the first substrate transfer unit 42a to proceed to transfer out the wafer W. An area where the holding members 21b are arranged corresponds to a substrate storing area of the wafers W.

In addition, the purge storage 21 is open in the front (opening 21d), both sides, and the bottom. Because the inside of the purge storage unit 2 is maintained at a negative pressure due to evacuation through the evacuation portion 12, the purge gas flows from the loader module 42 into the purge storage 21 through the opening 21d, over surfaces of the wafers W stored in the substrate storing area, and further flows into a space inside the unit cover 11 from the both sides.

The purge storage 21 is coupled to the elevation mechanism 22 as a shifting mechanism that is composed of, for example, a ball screw, a linear motor or the like and attached on an inner wall of the unit cover 11, as shown in FIGS. 3, 4. Thus, the purge storage 21 as a whole can be elevated independently from the dummy storage 31.

The dummy storage unit 3 is composed of a dummy storage 31, which is a second storage shelf for storing the dummy substrates DW, and an elevation mechanism 32 for independently elevating the dummy storage 31. The dummy storage 31 is configured so that the dummy substrates DW are housed in a stacking manner by holding edge portions of the dummy substrates DW in, for example, a chassis having a front opening. In addition, the dummy storage 31 is coupled to the elevation mechanism 32 as a shifting mechanism attached on the inner wall of the unit cover 11 in order not to interfere with the elevation mechanism 22, so that the dummy storage 31 as a whole can be elevated independently from the purge storage 21.

In addition, the purge storage 21 may be highly-placed whereas the dummy storage 31 is lowly-placed in the multi-storage unit 1 as shown in FIGS. 3 and 4, but the purge storage 21 may be lowly-placed whereas the dummy storage 31 is highly-placed.

When the elevation mechanism 22 is raised to the highest position, the purge storage 21 is located entirely above the transfer opening 42b formed in the side wall of the loader module 42. When the elevation mechanism 22 is lowered to the lowest position, the purge storage 21 is located in such a manner that the first substrate transfer unit 42a can access the highest holding member 21b in the wafer storing area. The elevation mechanism 32 holds the dummy storage 31 at the highest position in such a manner that the first substrate transfer unit 42a can access the highest holding member 21b in the substrate storing area, and at the lowest position in such a manner that the dummy storage is located entirely below the transfer opening 42b.

In addition, the substrate processing apparatus 4 is connected to a controlling portion 13 that controls the substrate transfer units 42a, 44a, the shifting mechanisms (elevation mechanisms 22, 32) of the multi-storage unit 1, the gate valves G1 through G3, and members or the like of the processing modules 45a through 45d. The controlling portion 13 is composed of a computer including a central processing unit (CPU), and programs regarding various operations of the components provided in the multi-storage unit 1. The programs include one program incorporating a group of steps (instructions) for controlling the operations of the purge storage unit 2 and the dummy storage unit 3. For example, such a program causes the purge storage unit 2 (or the dummy storage unit 3) to move so that the wafer W in the substrate storing area of the purge storage unit 2 (or the dummy storage unit 3) can be transferred by the first substrate transfer unit 42a. In addition, such a program is stored in a storage medium such as a hard disk, a compact disk, a magneto-optical disk, a memory card, and the like, and installed into the computer.

With the above configurations, the substrate processing apparatus 4 operates at a normal operation in the following manner. First, the wafer W stored in the carrier C on the load port 41 is brought out by the first substrate transfer unit 42a, aligned in an alignment chamber (not shown) on the way of being transferred through the loader module 42, transferred out to the left or right load lock chambers 43, and then stays idle therein. When the load lock chamber 43 is evacuated to a vacuum, the wafer W is brought out by the second substrate transfer unit 44a from the load lock chamber 43, transferred through the transfer module 44, and undergoes a predetermined process in one of the processing modules 45a through 45d. When different processes are successively carried out in the processing modules 45a through 45d, the wafer W is transferred to the processing modules 45a through 45d necessary for the successive processes by the transfer module 44. After the necessary processes are completed, the wafer W is transferred back to the load lock chamber 43 along a route opposite to the route at the time of being transferred in.

When the processed wafer W is brought out by the first substrate transfer unit 42a from the load lock chamber 43, the first substrate transfer unit 42a stores the wafer W in the purge storage 21 of the multi-storage unit 1, and the wafer W is temporarily stored therein. In the purge storage 21, the purge gas flow is produced, and the reaction products condensed on the processed wafer W are blown off by the purge gas and thus removed from the surface of the wafer W. The wafer W is stored for a predetermined period of time in the purge storage 21, and the wafer W from which the reaction products are removed is brought out by the first substrate transfer unit 42a from the purge storage 21, and stored back to the original carrier C.

In addition, the substrate processing apparatus 4 has a function of periodically cleaning the processing modules 45a through 45d. Such cleaning is carried out during a period of time when the normal processing on the wafer W is not carried out. The dummy substrate DW is brought out from the dummy storage 31 (FIGS. 3, 4), transferred to one of the processing modules 45a through 45d subject to the cleaning, and placed on the wafer receiving surface of the susceptor in the process chamber. Because the wafer receiving surface is covered by the dummy substrate DW, the surface is prevented from being etched. After the cleaning is completed, the dummy substrate DW is transferred along a route opposite to the route at the time of being transferred in, and further to the dummy storage 31 of the multi-storage unit 1. In addition, when seasoning in which an etching cycle is carried out several times after the cleaning or part replacement for the purpose of stabilizing process conditions is carried out in the processing modules 45a through 45d, the dummy substrate DW may be used.

Figure 6:
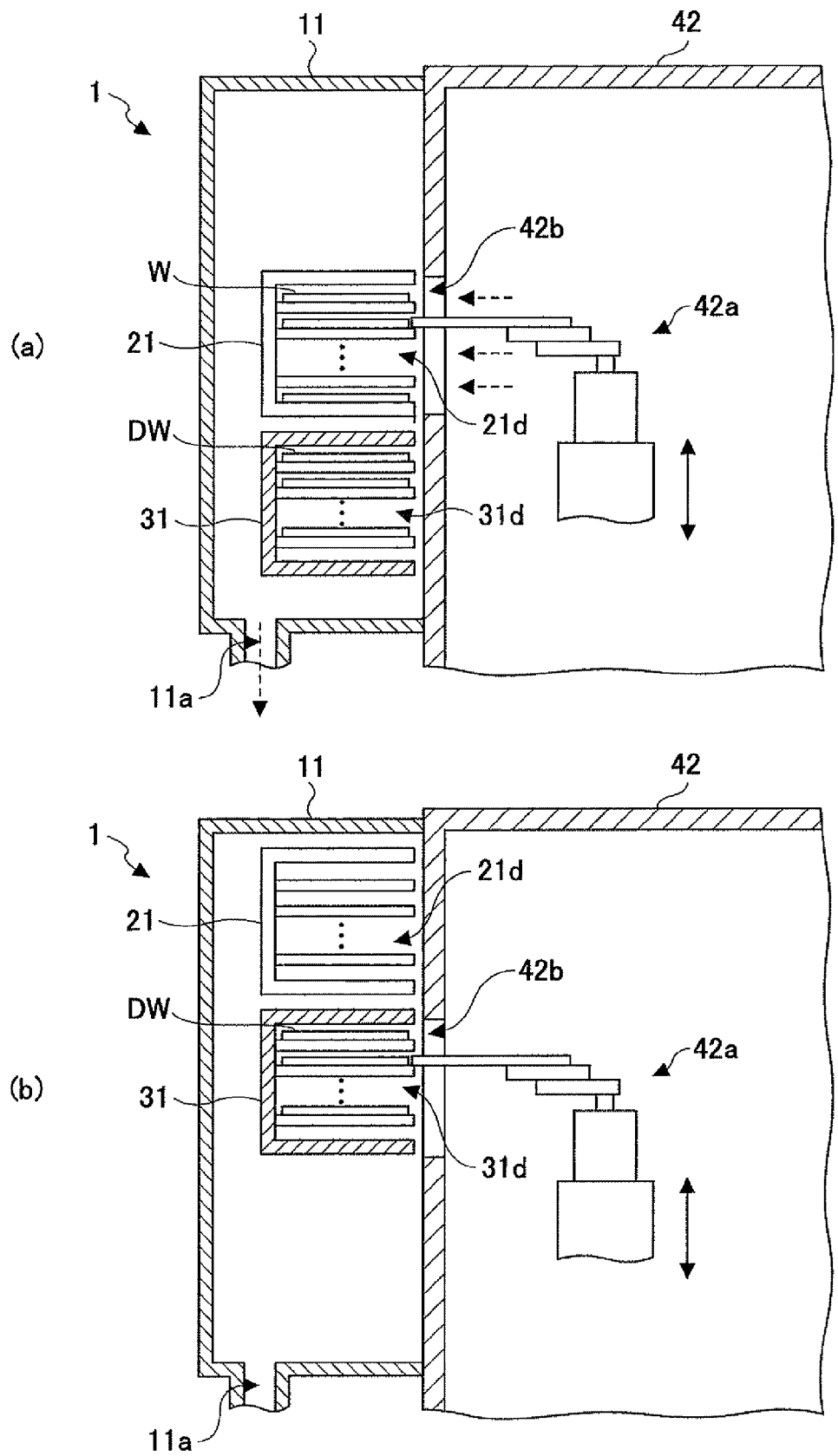
FIG. 6 is an explanatory view illustrating functions of the multi-storage unit.

Next, operations of the multi-storage unit 1 of the substrate processing apparatus 4 according to this embodiment are explained with reference to FIG. 6. FIG. 6(a) is a schematic view of the multi-storage unit 1 when the substrate processing apparatus 4 is normally operating, and FIG. 6(b) is a schematic view of the multi-storage unit 1 when the substrate processing apparatus 4 is carrying out the cleaning. Incidentally, the elevation mechanisms 22, 32 and the like are omitted for simplicity of illustration.

First, the dummy storage 31 is moved as a whole below the transfer opening 42b (i.e., to the lowest position) during the normal operation, as shown in FIG. 6(a). On the other hand, the purge storage 21 is moved to a position so that the opening 21d of the purge storage 21 opposes the transfer opening 42b in order that the wafer W is transferred between the purge storage 21 and first substrate transfer unit 42a. At this time, a flow of air (purge gas) is produced that flows into the purge storage 21 from the loader module 42 through the opening 42b, then further into the purge storage 21, flows over the surface of the wafer W, flows out from the sides of the purge storage 21, and is evacuated from the evacuation opening 11a. Incidentally, when the transfer opening 42b opposes the substrate storing area of the purge storage 21 as described above, it is assumed that the storages 21, 31 are at their home positions, in the following explanation.

After the storages 21, 31 are moved as described above, the first substrate transfer unit 42a brings out the processed wafer W from one of the load lock chambers 43, and moves the wafer W so that the wafer W opposes the transfer opening 42b. The first substrate transfer unit 42a and the purge storage 21 are moved vertically relative to each other so that the first substrate transfer unit 42a can access the holding member 21b in which no wafer W is placed. Then, the arm of the first substrate transfer unit 42a stretches and keeps the wafer W slightly above the holding member 21b. Next, the first substrate transfer unit 42a is lowered to place the wafer W on the holding member 21b.

After this, the wafer W is held on the holding member 21b until a predetermined period of time passes. During this period of time, the reaction products adsorbed on the surface of the wafer W is blown off by the purge gas as described above. After the period of time passes, the wafer W is transferred along the opposite route from the above-mentioned route by the first substrate transfer unit 42a, and back to the original carrier C. The above operations are repeated for the plural wafers W, and thus the plural wafers W are stored all together in the substrate storing area in the purge storage 21.

In addition, because the dummy substrates DW stored in the purge storage 31 at this time are separated from an inner space inside the unit cover 11 by the dummy storage 31 itself and the side wall of the loader module 42, the reaction products blown off from the wafer W in the purge storage 21 are less likely to be adsorbed on the dummy substrate DW.

In contrast, the purge storage 21 as a whole is moved upward as shown in FIG. 6(b) at the time of cleaning. Because the cleaning of the processing modules 45a through 45d is carried out when the normal process is not carried out in the substrate processing apparatus 4, no wafers W are stored in the purge storage 21.

On the other hand, the dummy storage 31 is moved so that the opening 31d of the dummy storage 31 opposes the transfer opening 42b to allow the wafer W to be transferred between the dummy storage 31 and the first substrate transfer unit 42a. The first substrate transfer unit 42a brings out the dummy substrate DW necessary to carry out the cleaning from the dummy storage 31, and transfers the dummy substrate DW to the load lock chamber 43. Then, the dummy substrate DW is transferred to the processing modules 45a through 45d subject to the cleaning. After the cleaning is completed, the dummy substrate DW is returned to the load lock chamber 43, and transferred back to the original substrate storing area. The above operations are repeated a predetermined number of times corresponding to the number of the dummy substrates DW necessary for the cleaning, and use of the dummy substrates DW for all the processing modules 45a through 45d is completed. After the cleaning is completed, the storages 21, 31 are moved to the home positions, and stay idle until the next normal process is started.

The substrate processing apparatus 4 according to this embodiment has the following advantages. The plural kinds of the substrate storing shelves (the purge storage 21, the dummy storage 31) provided for different storing purposes are aggregated as one unit in the multi-storage unit 1, and an access position of the first substrate transfer unit 42a is shared for the substrate storing shelves, and the substrate storing shelves are moved so that each shelf is located in the access position. Because the access position is only necessary to be set at one appropriate position taking into consideration a moving area of the substrate storing shelves, designing flexibility of the layout of the substrate processing apparatus 4 is enhanced and the layout is easily carried out, compared with a case where different kinds of the substrate storing shelves are independently arranged in different places and connected to the loader module.

In addition, because the multi-storage unit 1 is arranged on the side surface of the loader module 42, maintenance for the storages 21, 31 are easily carried out, compared with a case where the dummy storage 116 (FIG. 1) is arranged in a narrow area surrounded by the loader module 114, the load lock chamber 115, and the processing modules 112d as in the conventional substrate processing apparatus 100 shown in FIG. 1.

Moreover, because the dummy storage 31 is separated from the inner space of the unit cover 11 of the dummy storage unit 1 in which the purge gas flows, the reaction products in the purge gas are less likely to be adsorbed on the dummy substrate DW. With this, a problem in that the reaction products are adsorbed on the dummy substrate DW, brought into the processing modules 45a through 45d along with the dummy substrate DW, and spread around is prevented. Furthermore, the purge storage 21 and the dummy storage 31 are independently elevatable, so that the storages 21, 31 can be moved further away from the transfer opening 42b of the loader module 42.

Figure 7:
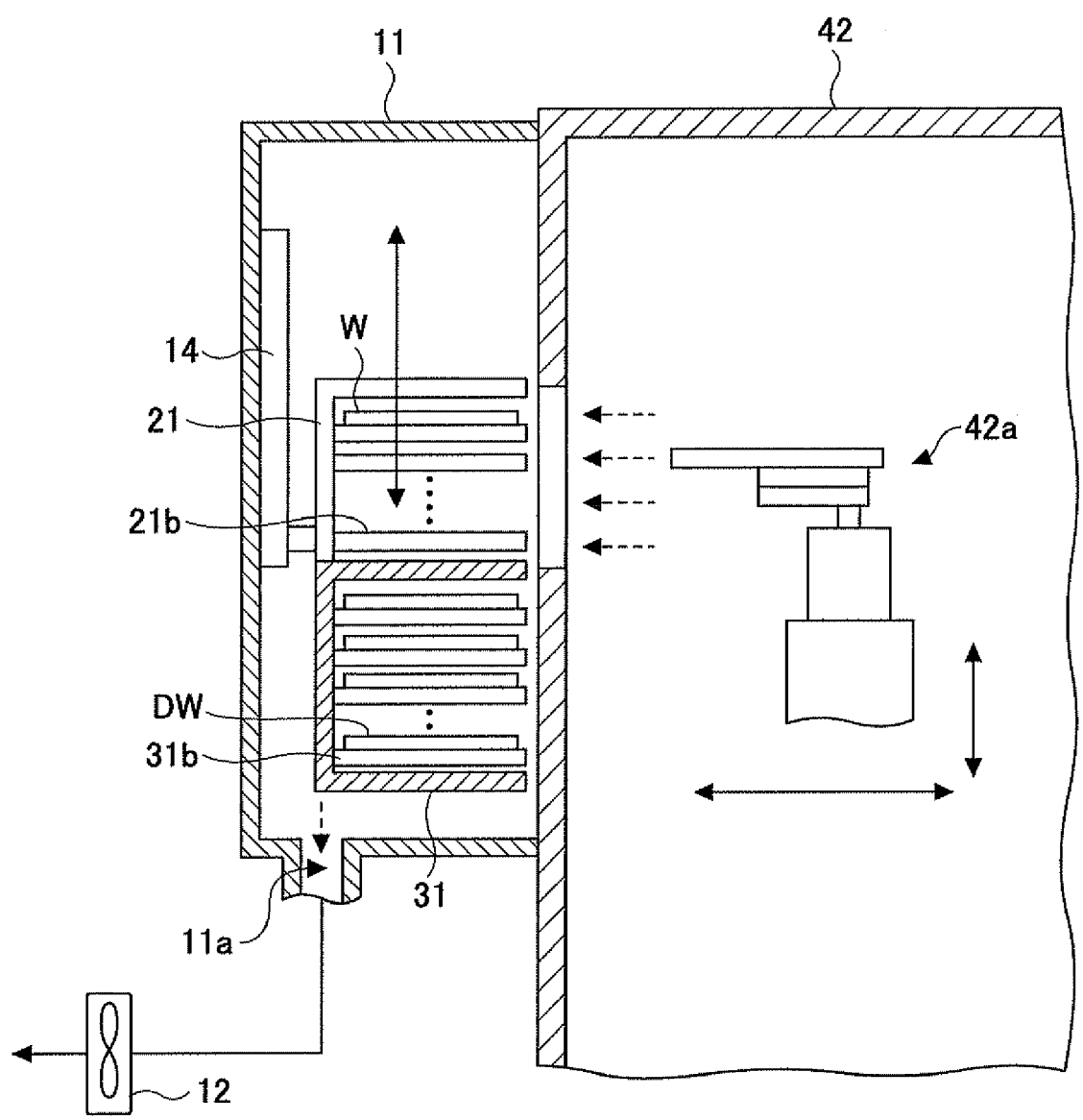
FIG. 7 is a cross-sectional view illustrating a modification example of the multi-storage unit.

While the above embodiment is configured so that the two storages 21, 31 arranged vertically are independently elevatable, these storages 21, 31 may be moved in unison. For example, as shown in FIG. 7 (a cross-sectional view), the purge storage 21 and the dummy storage 31 may be integrally configured and coupled to a shared elevation mechanism 14, so that the two storages 21, 31 are elevated in unison.

(Second Embodiment)

Figure 8:
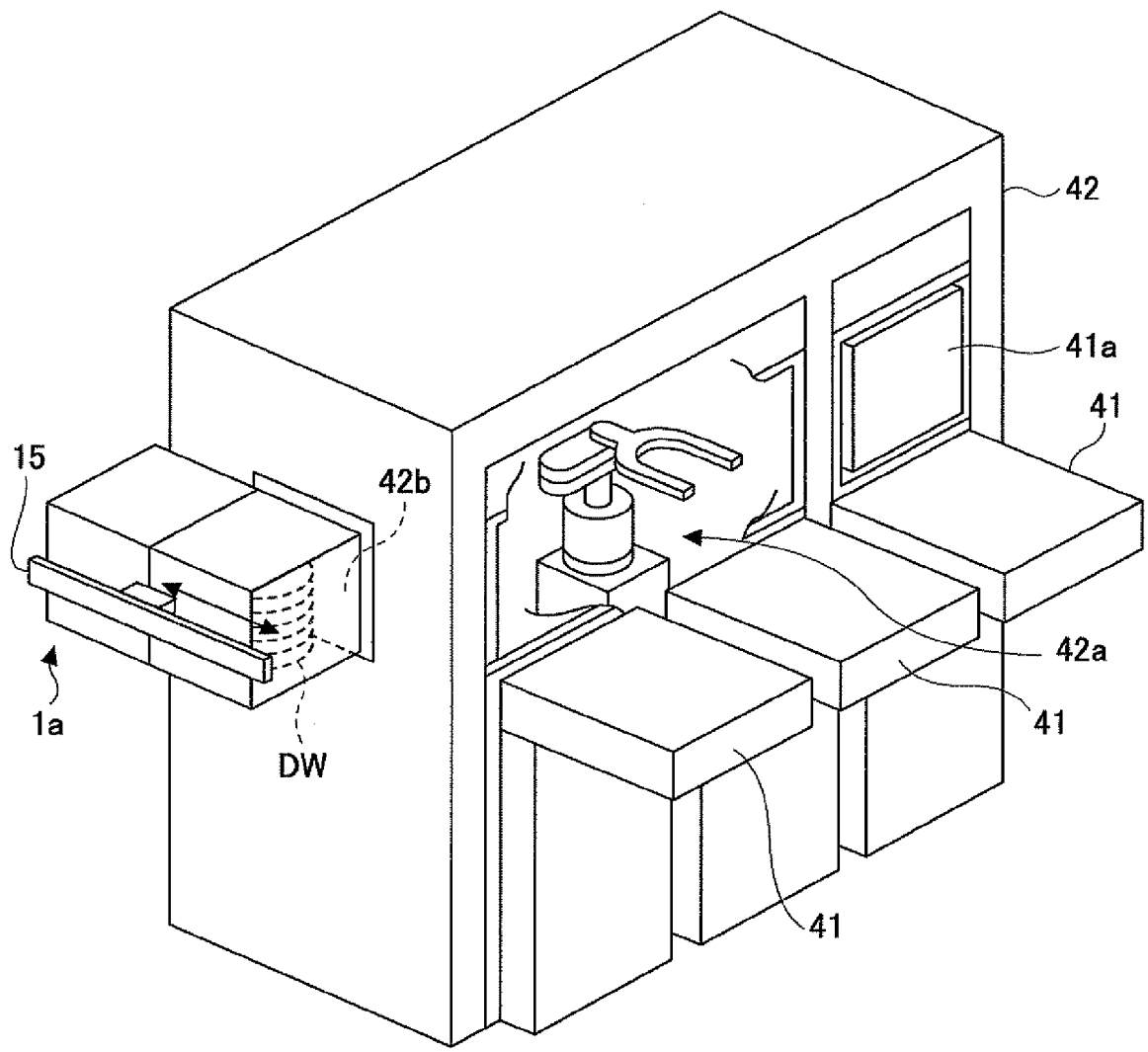
FIG. 8 is a perspective view illustrating an inner structure of a multi-storage unit according to a second embodiment.
Figure 9:
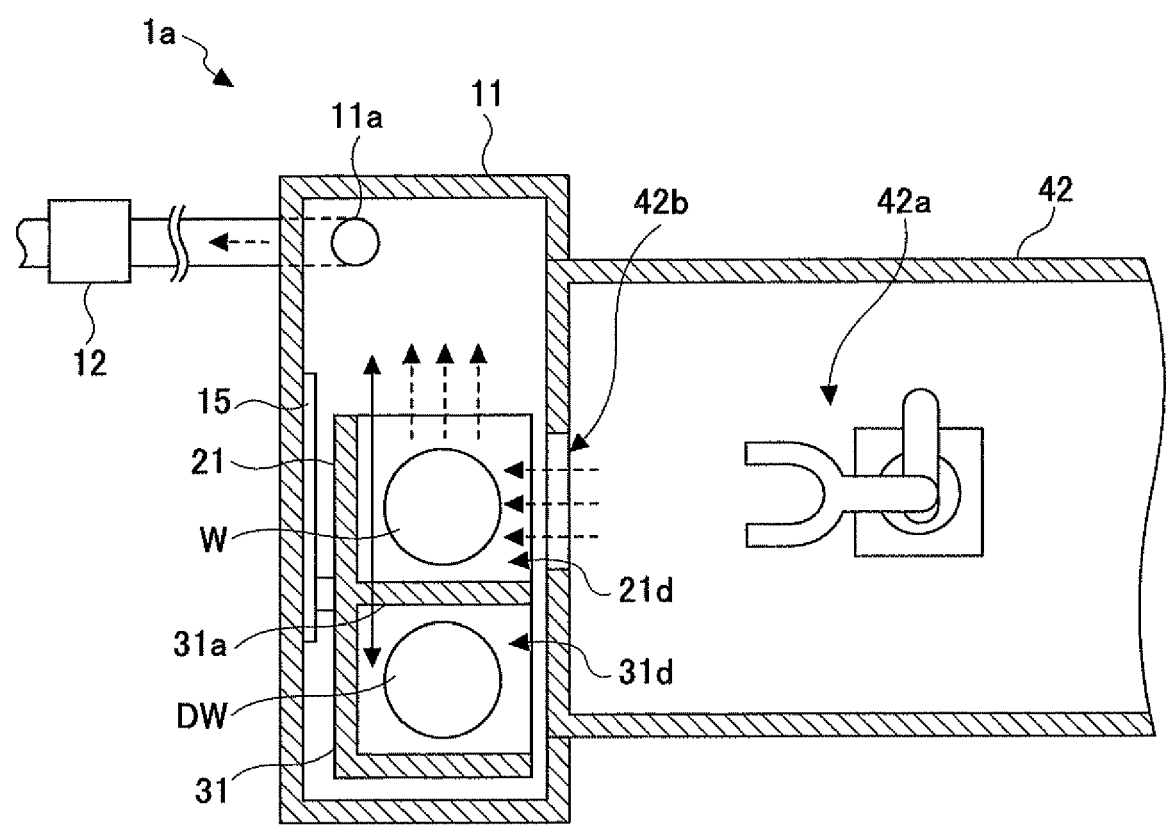
FIG. 9 is a plan view illustrating an inner structure of the second multi-storage unit.

Next, a substrate processing apparatus according to a second embodiment of the present invention is explained. The substrate processing apparatus according to the second embodiment is different in terms of the multi-storage unit from, and substantially the same in other configurations as the substrate processing apparatus according to the first embodiment. In the following, differences are mainly explained. FIG. 8 is a perspective view illustrating an inner configuration of a multi-storage unit 1a and FIG. 9 is a plan view of the inner configuration. In FIGS. 8 and 9, the same or similar reference numerals are given to the same or similar members or components as those in the substrate processing apparatus 4 according to the first embodiment, and repetitive explanations are omitted. Incidentally, the unit cover 11 of the substrate processing apparatus is removed in FIG. 8.

In the second embodiment, the purge storage 21 and the dummy storage 31 are integrally formed in line from side to side, as shown in FIGS. 8, 9. In addition, the substrate storing areas of the purge storage 21 and the dummy storage 31 are isolated by an isolation wall 31a. The multi-storage unit 1a is different from the multi-storage unit 1 of the first embodiment, where the vertically arranged storages 21, 31 are elevated, in that the purge storage 21 and the dummy storage 31 are coupled to a shared shifting mechanism 15 and movable from side to side. The multi-storage unit 1a is substantially the same as the first embodiment in that the evacuation opening 11a for the purge gas is provided at the bottom of the unit cover 11 and connected to the evacuation portion 12.

According to such a configuration, the storages 21, 31 as a whole are moved to the left, seen from the transfer opening 42b, in the multi-storage unit 1a of the second embodiment as shown in FIG. 9, and the substrate storing area of the purge storage 21 is aligned to the transfer opening 42b. The processed wafer W is transferred into, stored in, and transferred out from the purge storage 21. At this time, the purge gas flows into the inside space of the cover unit 11 from the loader module 42 through the transfer opening 42b, over the upper surface of the wafer W in the purge storage 21, and is evacuated from the evacuation opening 11a. Namely, the purge gas is blocked by the isolation wall 31a provided between the purge storage 21 and the dummy storage 31, and thus does not flow into the dummy storage 31.

On the other hand, the storages 21, 31 as a whole are moved to the right, seen from the transfer opening 42b, and the substrate storing area of the dummy storage 31 is aligned to the transfer opening 42b. The dummy substrate DW stored in the dummy storage 31 is transferred into and out of the dummy storage 31. According to the second embodiment, because a height of the multi-storage unit 1a is reduced, a space below the multi-storage unit 1a can be effectively used, for example.

(Third Embodiment)

Figure 10:
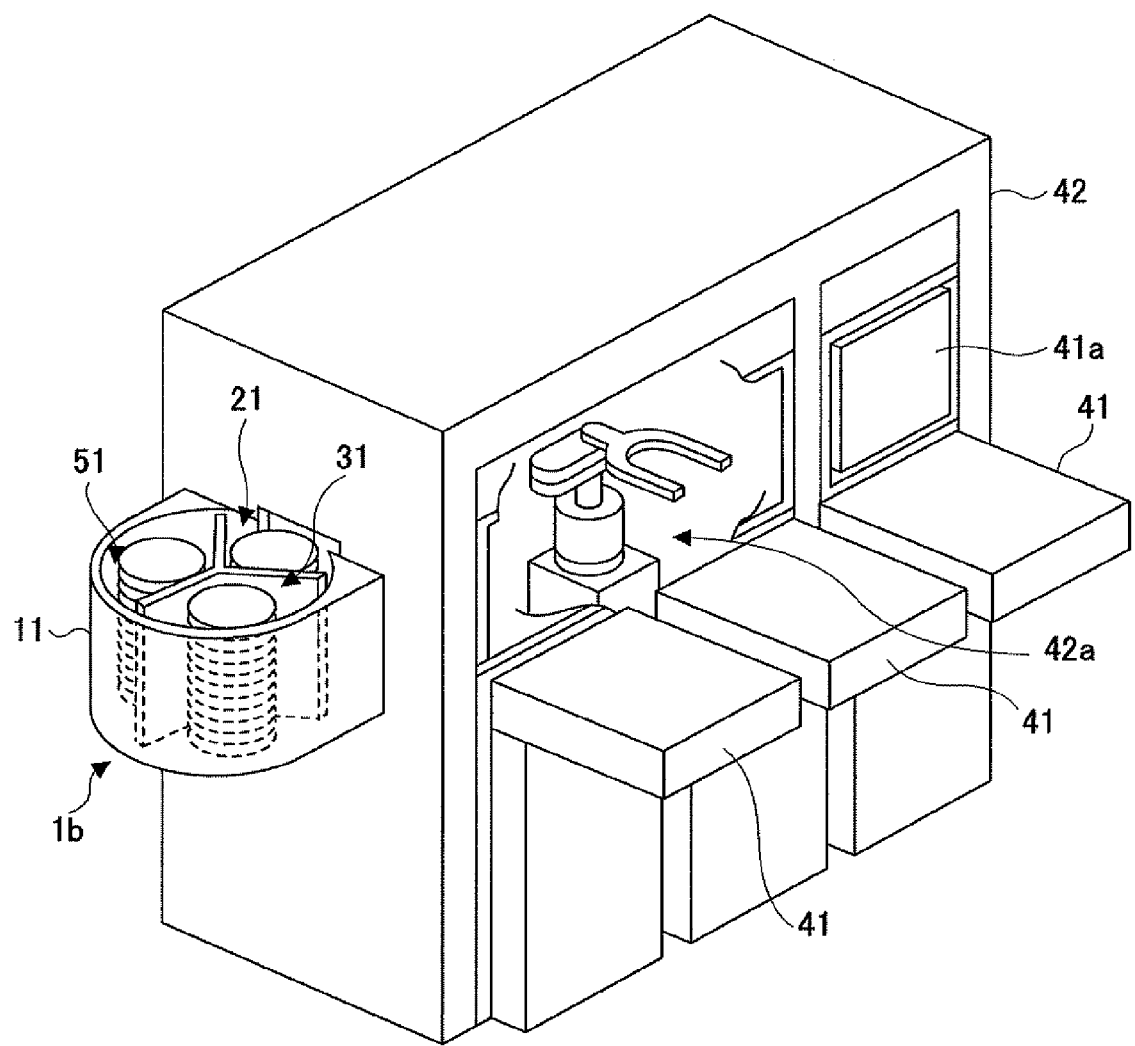
FIG. 10 is a perspective view illustrating an inner structure of a multi-storage unit according to a third embodiment.
Figure 11:
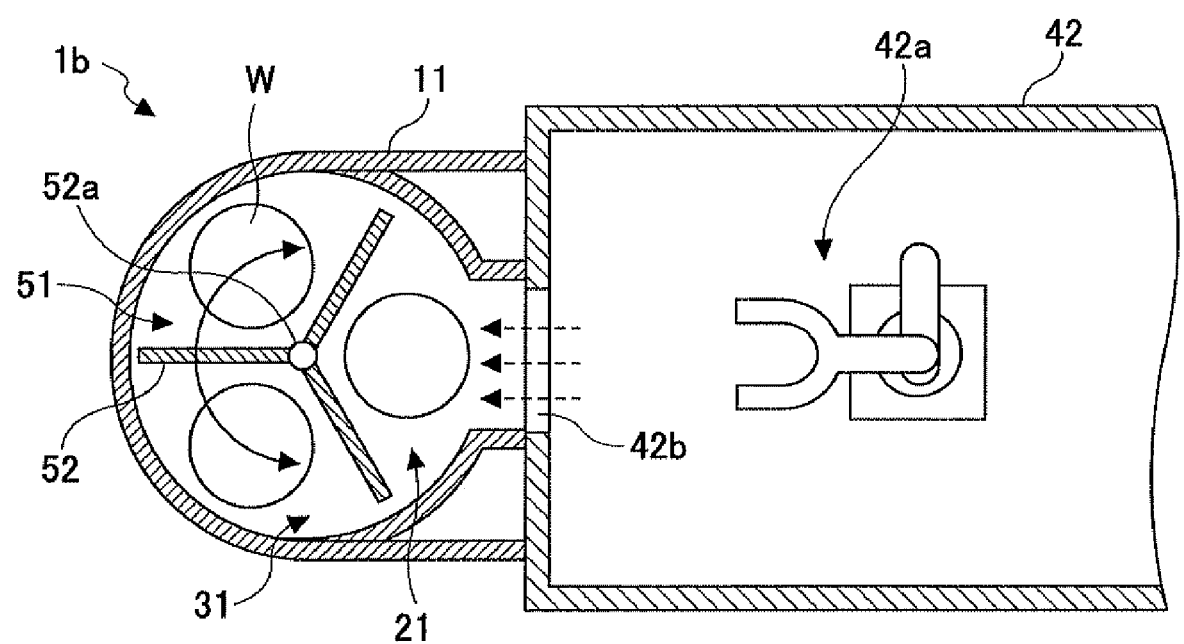
FIG. 11 is a plan view illustrating an inner structure of the third multi-storage unit.
Figure 12:
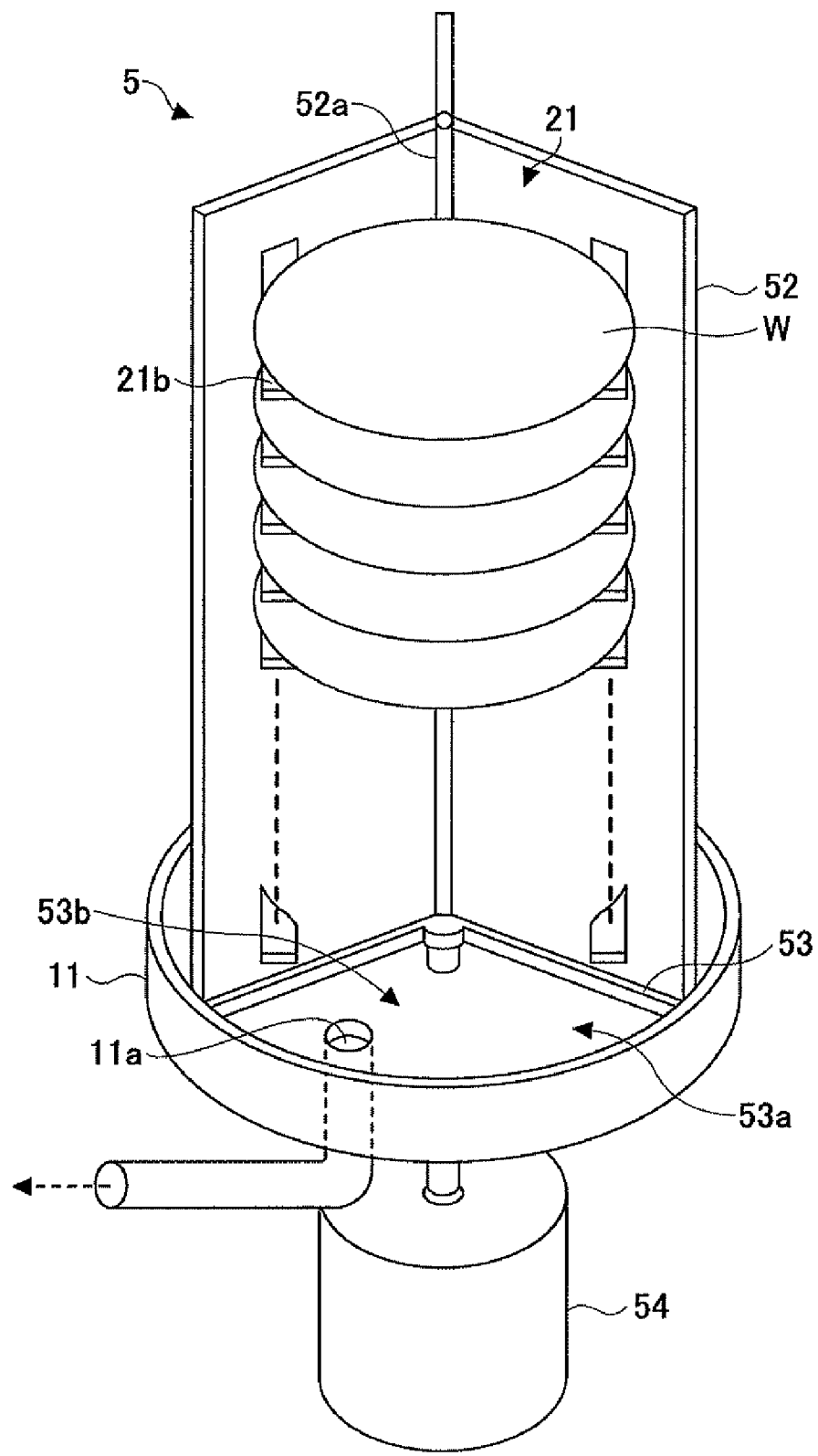
FIG. 12 is a perspective view of a rotational member provided inside the third multi-storage unit.

Next, a substrate processing apparatus according to a third embodiment is explained. While, in the substrate processing apparatuses according to the first and the second embodiments, examples where the two kinds of storing shelves, i.e., the purge storage 21 and the dummy storage 31 are provided are explained, three or more kinds of storing shelves are provided in the third embodiment. FIG. 10 is a perspective view illustrating a multi-storage unit 1b of the substrate processing apparatus according to the third embodiment, and FIG. 11 is a plan view of the multi-storage unit 1b. In addition, FIG. 12 is a perspective view of a rotating member 5 inside the multi-storage unit 1b. In FIGS. 10 through 12, the same or similar reference numerals are given to the same or similar members or parts as those in the first and the second embodiments, and repetitive explanations are omitted.

As shown in FIGS. 10, 11, the multi-storage unit 1b according to the third embodiment has substantially a shape of a cylinder and the inside space is divided by, for example, three vertical plates 52 extending in a radius direction from a vertical axis corresponding to a cylinder center axis. Three spaces so formed are used as the purge storage 21, the dummy storage 31, and another storage 51 for another purpose. The storage 51 is used, for example, for the purpose of heating or the like.

The three vertical plates 52 are attached on a shared rotational shaft 52a as shown in FIG. 12, and constitute a rotational member that is rotatable by a rotary motor 54 coupled to a base portion of the rotational shaft 52a. Each of the storages 21, 31, 51 is arranged along a circumferential direction of the vertical axis of the rotational member that rotates around the vertical axis, and the rotational member is rotated by the rotary motor 54 serving as the shifting mechanism.

Referring to FIG. 12, the holding members 21b are arranged at the same vertical intervals in each of the vertical plates 52, and an area where these holding members 21b are arranged is the substrate holding area.

In addition, the purge storage 21 is provided at the bottom with a bottom plate 53 that is rotatable with the vertical plates 52. A flattened cavity 53b is formed between the bottom plate 53 and the unit cover 11. A relatively large flow opening 53a is provided in the bottom plate 53, and thus the purge gas flowing in the purge storage 21 can flow into the cavity 53 at the bottom of the cover unit 11 through the flow opening 53a and be evacuated from the evacuation opening 11a formed at the bottom of the cavity 53b. The dummy storage 31 and the storage 51 have substantially the same configuration but are different from the purge storage 21 in that the flow opening 53a is not formed in the bottom plate 53 and thus the dummy storage 31 and the storage 51 are isolated from the cavity 53b in the bottom of the cover unit 11.

With the above configuration, the substrate storing area of the purge storage 21 is aligned to the transfer opening 42b as shown in FIG. 11 and the first substrate transfer unit 42a is elevated, so that the processed wafer W is transferred into, stored in and transferred out from a predetermined position, by the arm of the first substrate transfer unit 42a at the time of the normal operation. On the other hand, when the cleaning or seasoning is carried out in the processing modules 45a through 45d, the rotational member is rotated so that the substrate storing areas of the storages 31, 52 are aligned to the transfer opening 42b depending on the purposes, the necessary dummy substrate DW or a test wafer W is used. According to the third embodiment, two or more kinds of the wafers can be stored in a compact area, thereby improving convenience.

This international patent application contains subject matter related to Japanese Patent Application No. 2007-095376, filed on Mar. 30, 2007, with the Japanese Patent Office, the entire contents of which are hereby incorporated herein by reference.

The invention claimed is:

1. A substrate processing apparatus for bringing a substrate out from a carrier placed on a transfer port, by a substrate transfer portion inside a transfer chamber, into a processing module in order to perform a substrate process in the processing module, the substrate processing apparatus comprising:
   a substrate storing chamber coupled to an exterior of the transfer chamber via a transfer opening in order to be in communication with the transfer chamber;

a first storage that is provided in the substrate storing chamber and includes plural substrate holding members that hold corresponding one of plural substrates thereby to store the plural substrates for a first storing purpose;

a second storage that is provided in the substrate storing chamber and includes plural substrate holding members that hold corresponding one of plural substrates thereby to store the plural substrates for a second storing purpose different from the first storing purpose; and a shifting mechanism that shifts the first storage and the second storage in order to position a substrate storing area of one of the first storage and the second storage so that substrate transferring is enabled between the substrate storing area and the substrate transfer portion via the transfer opening.

2. The substrate processing apparatus recited in claim 1, wherein at least one of the plural substrates is processed under a vacuum environment in the processing module,
wherein the transfer chamber includes
a normal pressure transfer chamber at a normal pressure, the normal pressure transfer chamber being coupled to the transfer port and having a first substrate transfer chamber; and
a vacuum transfer chamber provided between the normal pressure transfer chamber and the processing chamber and having a second substrate transfer portion, and
wherein the substrate storing chamber is coupled to the normal pressure transfer chamber.

3. The substrate processing apparatus recited in claim 1, wherein a flow of a purge gas may be produced in the first storage in order to blow off a reaction product on the substrate that has been processed in the processing module.

4. The substrate processing apparatus recited in claim 3, wherein the substrate storing chamber includes an evacuation opening that evacuates the purge gas in order to produce the purge gas flow.

5. The substrate processing apparatus recited in claim 1, wherein the second storage stores a dummy substrate.

6. The substrate processing apparatus recited in claim 1, wherein the first storage and the second storage are vertically arranged, and
wherein the shifting mechanism is configured to elevate the first storage and the second storage.

7. The substrate processing apparatus recited in claim 6, wherein the shifting mechanism is configured to independently elevate the first storage and the second storage.

8. The substrate processing apparatus recited in claim 6, wherein the shifting mechanism is configured to elevate the first storage and the second storage in unison.

9. The substrate processing apparatus recited in claim 1, wherein the first storage and the second storage are arranged in line from side to side, seen from the transfer opening, and
wherein the shifting mechanism is configured to move the first storage and the second storage from side to side.

10. The substrate processing apparatus recited in claim 1, wherein the first storage and the second storage are arranged on a rotational member rotatable around a vertical axis in order to surround the vertical axis, and
wherein the shifting mechanism is configured to rotate the rotational member.

11. The substrate processing apparatus recited in claim 4, wherein the substrate storing area of the second storage is isolated from the purge gas flow.

12. The substrate processing apparatus recited in claim 11, wherein the second storage includes a chassis having an opening, and
wherein the opening faces an outer wall of the substrate transfer chamber so that the substrate storing area of the second storage is isolated from the purge gas flow.

13. The substrate processing apparatus recited in claim 11, wherein the first storage and the second storage are defined by plural vertical plates that are arranged on a rotational member rotatable around a vertical axis, the plural vertical plates extending in a radius direction of the rotational member,
wherein the shifting mechanism is configured to rotate the rotational member, and
wherein the plural vertical plates isolate the substrate storing area of the second storage from the purge gas flow.

* * * * *